(12) United States Patent
Moriya et al.

(10) Patent No.: US 7,866,039 B2
(45) Date of Patent: Jan. 11, 2011

(54) METHOD FOR MANUFACTURING WIRING BOARD FOR AN IMAGE DISPLAY

(75) Inventors: Masafumi Moriya, Hiratsuka (JP);
Kazuya Ishiwata, Yokosuka (JP);
Yoshio Suzuki, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 787 days.

(21) Appl. No.: 11/761,923

(22) Filed: Jun. 12, 2007

(65) Prior Publication Data
US 2008/0005899 A1 Jan. 10, 2008

(30) Foreign Application Priority Data
Jul. 10, 2006 (JP) ............................. 2006-189282

(51) Int. Cl.
*H01K 3/10* (2006.01)
(52) U.S. Cl. ............................. 29/852; 29/846; 29/851; 174/257; 257/88
(58) Field of Classification Search ................... 29/831, 29/846, 847, 851, 852; 174/250, 257; 257/88, 257/89, 91, 330; 313/500; 438/297, 669
See application file for complete search history.

(56) References Cited

U.S. PATENT DOCUMENTS

| | | | | |
|---|---|---|---|---|
| 4,303,931 | A * | 12/1981 | Gaffre | 257/89 |
| 5,373,174 | A * | 12/1994 | Yamamoto | 257/91 |
| 6,653,232 | B2 | 11/2003 | Uda et al. | 438/669 |
| 6,758,712 | B2 | 7/2004 | Kubo et al. | 445/24 |
| 6,803,707 | B2 | 10/2004 | Ishiwata et al. | 313/310 |
| 6,815,884 | B2 | 11/2004 | Yamada et al. | 313/495 |
| 6,853,117 | B2 | 2/2005 | Toshima et al. | 313/304 |
| 6,866,989 | B2 | 3/2005 | Watanabe et al. | 430/394 |
| 6,902,455 | B2 | 6/2005 | Yanagisawa et al. | 445/24 |
| 6,903,504 | B2 | 6/2005 | Watanabe et al. | 313/495 |
| 7,064,475 | B2 | 6/2006 | Kuroda et al. | 313/311 |
| 7,095,168 | B2 | 8/2006 | Meguro et al. | 313/495 |
| 7,211,943 | B2 | 5/2007 | Watanabe et al. | 313/495 |
| 7,285,428 | B2 | 10/2007 | Uda et al. | 438/4 |
| 7,387,903 | B2 * | 6/2008 | Sakai et al. | 438/597 |
| 2005/0019707 | A1 | 1/2005 | Watanabe et al. | 430/394 |

(Continued)

FOREIGN PATENT DOCUMENTS

JP 2002-203475 A 7/2002

(Continued)

OTHER PUBLICATIONS

Printout from hyperlink on Sep. 9, 2010, http://en.wikipedia,org/wiki/Contact_angle, pp. 1-4.

*Primary Examiner*—Donghai D. Nguyen
(74) *Attorney, Agent, or Firm*—Fitzpatrick, Cella, Harper & Scinto

(57) ABSTRACT

A method of manufacturing a wiring board comprising preparing a substrate having a groove and an adjacent area; the substrate being of a wiring board also comprising a first wiring having first and second portions provided in first and second areas, respectively, making a contact angle of the second area different from a contact angle of a third area which is another part of the adjacent area, surrounding the second area together with the groove; and applying conductive paste to at least the first and second areas.

16 Claims, 7 Drawing Sheets

U.S. PATENT DOCUMENTS

| | | | |
|---|---|---|---|
| 2005/0148269 A1 | 7/2005 | Uda et al. | 445/6 |
| 2006/0186781 A1 | 8/2006 | Kuroda et al. | 313/311 |
| 2006/0194156 A1 | 8/2006 | Watanabe et al. | 430/394 |
| 2008/0001516 A1 | 1/2008 | Moriya et al. | 313/483 |
| 2008/0001517 A1 | 1/2008 | Moriya et al. | 313/483 |

FOREIGN PATENT DOCUMENTS

| | | |
|---|---|---|
| JP | 2005-190769 A | 7/2005 |

* cited by examiner

METHOD FOR MANUFACTURING WIRING BOARD FOR AN IMAGE DISPLAY

BACKGROUND OF THE INVENTION

1. Field of the Invention

The present invention relates to a manufacturing method of wiring board, manufacturing method of electron source, manufacturing method of image display apparatus and image reproducing apparatus.

2. Description of the Related Art

In a flat panel display using an electron-emitting device, voltage is applied selectively to the electron-emitting device provided at each intersection of multiple wirings (matrix wirings) arranged in a matrix form or in the vicinity thereof so as to control emission of electrons from each electron-emitting device and display an image. The matrix wiring is constituted of scanning wiring to which a scanning signal is applied and signal wiring which intersects the scanning wiring and a modulation signal is applied to. In recent years, a display capable of displaying a highly fine image has been demanded. Thus, while wiring needs to be formed thinner, the film thickness of wiring needs to be increased in order to avoid increase in resistance of wiring due to the trend of forming the wiring thinner. Further, a display which can be produced more easily has been demanded.

As a resolution corresponding to these requests, Japanese Patent Application Laid-Open No. 2002-203475 and Japanese Patent Application Laid-Open No. 2005-190769 have disclosed art in which, with conductive paste disposed in a groove provided in a substrate surface, wiring is buried in the groove by baking and connected to an electron-emitting device provided near the groove.

However, in the method of printing conductive paste (paste containing wiring material) inside the groove provided in the surface of a substrate and baking it to provide wiring in the groove, sometimes a gap is generated between the wiring and the inner wall of the groove due to shrinkage by baking of wiring material at the time of baking. When the gap is generated, sometimes reliability of connection between an electrode (electrode connected to the electron-emitting device or electrode constituting the electron-emitting device) provided on the substrate surface near the groove and wiring in the groove is dropped. When the groove is filled completely with conductive paste in order to reduce the gap, if the temperature changes largely, sometimes wiring charged in the groove expands the inner wall of the groove due to a difference in thermal expansion coefficient between the substrate material and the wiring material so that crack or crevice is generated in the substrate. Improvement of the reliability of connection between the electrode provided on the substrate surface located near the groove and the wiring provided in the groove has been demanded.

SUMMARY OF THE INVENTION

An object of the present invention is to provide a manufacturing method of a wiring board in which reliability of connection between wiring provided in a groove and an electrode provided on the surface of a substrate located near the groove is improved.

(1) To achieve the above object, according to an aspect of the present invention, there is provided a method of manufacturing a wiring board comprising (A) a substrate having a groove and an adjacent area adjacent to the groove and (B) a first wiring having a first portion and a second portion extending from the first portion, the first portion being provided in a first area in the groove and the second portion being provided in a second area which is part of the adjacent area, the method comprising steps of: preparing a substrate having a groove; making a contact angle of the second area different from a contact angle of a third area which is another part of the adjacent area, surrounding the second area together with the groove; and applying conductive paste to at least an interior of the groove and part of the area adjacent to the groove.

(2) According to another aspect of the present invention, there is provided a method of manufacturing a wiring board comprising (A) a substrate having a groove and an adjacent area adjacent to the groove and (B) a first wiring having a first portion and a second portion extending from the first portion, the first portion being provided in a first area in the groove and the second portion being provided in a second area which is part of the adjacent area, the method comprising steps of: preparing a substrate having a groove; making a contact angle of the second area different from a contact angle of a third area which is another part of the adjacent area, sandwiching the second area; and applying conductive paste to at least an interior of the groove and part of the area adjacent to the groove.

(3) According to still another aspect of the present invention, there is provided a method of manufacturing an electron source comprising a wiring board having a first wiring and a second wiring; and a plurality of electron-emitting devices which are disposed on the wiring board and have a first electrode connected to the first wiring and a second electrode connected to the second wiring, wherein the wiring board is manufactured according to the manufacturing method of wiring board described in (1) and (2) above.

(4) According to a further aspect of the present invention, there is provided a manufacturing method of an image display apparatus comprising an electron source and a light-emitting member which emits light when electrons emitted from the electron source are irradiated, wherein the electron source is manufactured according to the manufacturing method of electron source described in (3) above.

(5) According to a still further aspect of the present invention, there is provided an image reproducing apparatus comprising at least a receiving unit for receiving at least one of broadcasting signal and a signal passing through electric communication network and an image display unit connected to the receiving unit, wherein the image display unit is manufactured according to the manufacturing method of image display apparatus described in (4) above.

Accordingly, connection between wiring provided in a groove and an electrode provided on the surface of a substrate located near the groove can be achieved easily and with a high reliability.

DESCRIPTION OF THE PREFERRED EMBODIMENTS

Hereinafter, an example of the manufacturing method of the wiring board (substrate having wirings) of the present invention will be described with reference to FIG. 9. An example of applying the wiring board to the electron source will be described also. FIG. 9 is a diagram showing manufacturing process of the wiring board and electron source.

An example of using a surface-conduction electron-emitting device as the electron-emitting device is shown here. Surface-conduction electron-emitting devices are constituted of conductive films having a gap and a pair of electrodes connected to both ends of the conductive film. Electron-emitting devices having at least two electrodes, such as, field emission electron-emitting device, MIM type electron-emitting device can be used as an electron source of the present invention. The wiring board which can be formed according to the manufacturing method of the present invention can be applied to various displays and boards such as liquid crystal display, organic EL display and plasma display. If any functional device such as the aforementioned electron-emitting device, EL device, TFT is disposed on the wiring board of the present invention and connected to a first conductor, a variety of electronic devices such as displays and circuits can be constructed.

<Manufacturing Method of Wiring Board and Electron Source>

(Process 1)

Figure 9A:
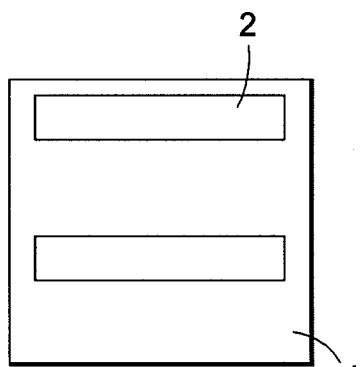
FIGS. 9A, 9B, 9C, 9D, 9E, 9F, 9G and 9H are diagrams showing manufacturing process of the wiring board and electron source of the present invention.

First, a substrate 1 is prepared and a multiplicity of grooves 2 extending in the X direction are formed at predetermined positions of the surface of the substrate 1 (FIG. 9A). Although the X direction is indicated with the right-left direction with respect to paper surface in FIG. 9, the groove 2 may be formed in a vertical direction (Y direction). That is, the direction of extension of the groove may be any predetermined direction.

As material of the substrate 1, any insulation material may be employed, particularly glass is preferable. Of course, it is permissible to use a substrate provided with the grooves 2.

Although a known method such as wet etching or dry etching may be used as a formation method of the groove 2, it is preferable to use sand blast method. Because the inner wall of the groove 2 formed by the sandblasting method has a great number of unevenness, charging the groove 2 of conductive paste may be carried out effectively. Further, this is also preferable because interference (occurrence of stress etc.) between the wiring 4 and the inner wall of the groove 2 obtained in subsequent baking process can be suppressed.

(Process 2)

Figure 9E:
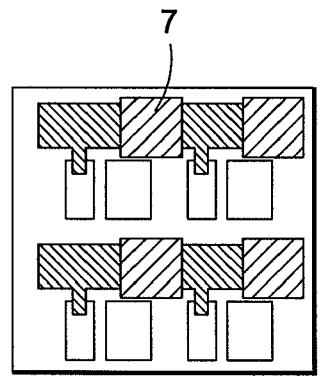
Figure 9B:
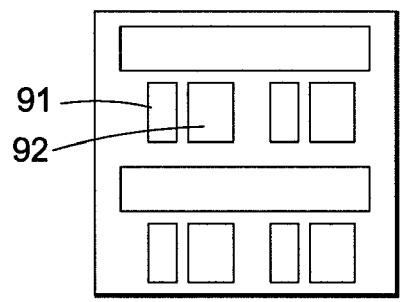

A first electrode 91 and a second electrode 92, which are a pair of electrodes, are provided on the surface (area) of the substrate 1 located beside the groove 2 (adjacent to the groove 2) (FIG. 9B).

As material of the electrode (91, 92), any conductive material may be used. For example, as material of the electrode (91, 92), metallic material may be used. Particularly, it is preferable to use chemically stable metallic material such as platinum. As manufacturing method of a pair of the electrodes, a conventionally known film forming method such as sputtering may be used.

Prior to process 2, film composed of silicon oxide is preferred to be provided on the surface of the substrate 1, at least in an area in which the electron-emitting device is to be disposed. It may be formed on the entire surface in which the grooves 2 of the substrate 1 are formed. The silicon oxide film may be formed by sputtering method or the like. By forming silicon oxide, alkali metal such as sodium harmful to the electron-emitting device formed on the pair of the electrodes 91, 92 can be prevented from dispersing from the substrate 1. In the meantime, the process of forming silicon oxide may be omitted.

(Process 3)

Next, the contact angle of a second area 712 (in which a portion (second portion of wiring) 5 extending from the major portion (first portion of wiring) of the wiring is provided, the second area being part of an area adjacent to the groove 2 (first area 711)) is set different from the contact angle of another portion (area in which the wiring (the first portion 4 and the second portion 5) is not provided) 720 of the area adjacent to the groove 2, sandwiching the second area 712. More specifically, the contact angle of the area 712 in which the second portion 5 is provided is set smaller than the contact angle of the portion 720 which is the surface of the substrate 1 except the groove 2 (the first area 712) and in which the second portion 5 (area around the second portion 5) of the wiring is not provided (FIG. 9C). Preferably, the contact angle between the first area 711 and the second area 712 which constitute the surface of the substrate 1 is set smaller than the contact angle of an area (area around the second portion 5 or a third area) 720 in which the second portion 5 of the wiring is not provided. Particularly preferably, the contact angles of the first area 711 and the second area 712 which constitute the surface of the substrate 1 are set equal. As an example of practical values, the contact angle of the area 710 in which the wiring is formed (first area 711 and second area 712) is set to 6° and the contact angle of the area (3, 720) in which no wiring is formed is set to 50° in the example shown in FIG. 4B. The aforementioned contact angle can be defined as a contact angle of solvent (main solvent) of conductive paste for forming the wiring (first portion 4 and second portion 5) with respect to the substrate 1. Because the second portion 5 needs to be connected to an electrode 91 in the example shown here, the second area 712 includes part of the electrode 91. That is to say, the contact angle of the electrode 91 at a portion connected to the second portion 5 (portion covered by part of the second portion 5) is set smaller than the contact angle of an area (area around the second portion 5 or a third area) 720 in which the second portion 5 of the wiring is not provided. Preferably, the contact angle of the electrode 91 connected to the second portion 5 (portion covered by part of the second portion 5) is set substantially equal to the contact angle of the first area 711.

The area 710 which is part of the surface of the substrate 1 and provided with the wiring (first portion 4 and second portion 5) is constituted of at least the first area 711 (area provided with the first portion 4 of the wiring) substantially corresponding to the inside of the groove 2 and the second area (area provided with the second portion 5 of the wiring) 712 (corresponds to passage portion of the present invention). Although the first area 711 is preferred to be set equal to the inside of the groove 2, their sizes may be slightly different from each other.

More conductive paste is supplied (poured) to the first area 711 than the second area 712 in a next process. Thus, conductive paste naturally spreads within the groove 2 (on the first area 711) due to its weight. In order for conductive paste which naturally spreads over the first area 711 to spread selectively on the second area 712 of the substrate 1, the contact angle of the second area 712 of the substrate 1 is typically set smaller than the contact angle of the third area 720 which is an area excluding the first area 711 and the second area of the substrate 1. Although FIG. 9C indicates an example that the surface of the substrate 1 is constituted of only the first area 711 the second area 712 and the third area 713, other area may exist. The role of the third area 720 is to control spreading of conductive paste from the first area 711. Thus, the third area 720 is provided so that conductive paste is branched selectively from the first area 711 to the second area 712 (the passage of conductive paste is to be specified). Generally, the viscosity of conductive paste is not so low. Practically, the third area 720 is provided so as to sandwich the second area 712 in an intersecting direction (typically in a perpendicular direction (X direction in FIG. 9)) to the direction (Y direction in FIG. 9) in which the second portion 5 of the wiring is branched from the first portion 4 and extends. In the present invention, as shown in FIG. 9C, preferably, the second area 712 is surrounded by the first area 711 (or the groove 2) and the third area 720 in order to strictly specify the spreading of conductive paste in the X direction and Y direction. In other words, according to the present invention, preferably the first area 711 is surrounded by the second area 712 and the third area 720. In the present invention, preferably, the first area (area which constitutes the surface of the substrate 1 while constituting the groove 2 (called groove)) and the second area 712 (area which constitutes the surface of the substrate 1 while extending from the groove 2) are surrounded by the third area 720. Consequently, the passage for conductive paste is specified by the third area 720 so as to control a pattern of wirings (4, 5) at a high accuracy. To connect the electrode 91 provided on the substrate 1 apart from the groove 2 with the wirings (4, 5) as described in this example, preferably, the third area 720 is provided to overlap part of the electrode 91.

Preferably, the value of the aforementioned contact angle is controlled appropriately corresponding to the main solvent (solvent) of conductive paste containing wiring material to be provided within the groove 2 in next process 4. Because organic solvent is generally used as the main solvent for the conductive paste, the second area 712 having the low contact angle can be said to be an area having a higher lipophilic property (lower oil repellent property) than the third area in the surrounding. In the area 710 (first area and second area) in which wiring is formed and the area 720 (third area) in which no wiring is formed, the wiring can be formed with an excellent reproducibility if the difference of the contact angle relative to the main solvent of conductive paste is 20° to 70°.

This process can be carried out by a following method. That is, the entire surface provided with the groove 2 in the substrate 1 is coated with silane coupling agent (for example, alkyl silane coupling agent) having oil repellent property (non-lipophilic property). Next, a photo mask having a light transmitting portion and a light shielding portion is provided between a low-pressure mercury lamp (wavelength: 254 nm) and the substrate 1 and ultraviolet light is irradiated to a predetermined area (first area 711 and second area 712) on the surface of the substrate 1. Consequently, the area irradiated with ultraviolet light (first area 711 and second area 712) can be adjusted to an area having a higher lipophilic property than the area not irradiated with ultraviolet light. Further, the area not irradiated with ultraviolet can be adjusted to the area 3 (720) having a higher oil repellent property than the area irradiated with ultraviolet light. In the meantime, the area 3 formed in the above method can be removed by heating process in the atmosphere such as baking process for conductive paste described later.

The second area 712 which conductive paste is branched from the first area 711 and flows in is formed by making the contact angle of a passage portion (second area 712) which is to be turned to a passage for conductive paste in the surface of the substrate 1 different from the contact angle of the surrounding portion 720 (third area) around the passage. Further, preferably, the first area 711 is surrounded by the third area 720.

(Process 4)

Conductive paste containing material for constituting the wiring is applied to the groove (on the area 711) and spread from the first area 711 to the second area 712. Then, the conductive paste is dried and baked in the air to form the first wiring (FIG. 9D).

The first wiring contains the first portion 4 disposed in the groove 2 and the second portion 5 which is branched from the groove 2 and extends from the first portion 4 onto the electrode 91 on the surface of the substrate 1. The first electrode 91 and the first wiring are connected in this process.

As the aforementioned conductive paste, it is preferable to use conductive paste containing a number of particles (conductive particles) of the material which constitutes the first wiring 4. Generally, organic solvent is used as solvent for the aforementioned particles as described above. In the meantime, solvent in the conductive paste for use in the present invention is not restricted to organic solvent.

Printing method can be adopted to apply the conductive paste into the groove 2. Preferably, silver particles are used as particles of the material which constitute the wiring. However, metallic material other than silver may be used.

When applying conductive paste into the groove 2, preferably the conductive paste is applied so as to rise from the surface of the substrate 1 (substrate surface). After that, the conductive paste is left under normal temperature for a while so that it spreads sufficiently from the first area 711 to the second area 712. Conductive paste spreads from the groove 2 (area 711) to a portion (second area 712) having a higher affinity to the solvent of conductive paste. The conductive paste can be blocked by a portion having a lower affinity to the solvent (area located around the second area 712 (surrounding portion 720)). In the meantime, conductive paste can be blocked by the third area 720 which surrounds the first area 711 and the second area 712 in a portion to be filled with conductive paste (portion not in contact with the second area 712 in the first area 711).

(Process 5)

Next, insulation layer 7 is formed on the portion (4) which serves as main body of the wiring (4, 5) (FIG. 9E).

Insulation layer 7 is provided such that no short circuit is caused between the wiring (, 5) and wiring 8 formed in next process. Although the example that the insulation layers 7 are provided at each intersection of the wiring 4 and wiring 8 separately has been shown here, the insulation layer 7 may be provided to cover the wiring 4 along the wiring 4 (X direction).

The insulation layer 7 can be formed by printing insulation paste. Photosensitive insulation paste may be used as the insulation paste for use in the printing method. By using the photosensitive insulation paste, the insulation layer 7 can be formed into a predetermined pattern.

As the material of the insulation layer 7, glass such as silicon oxide may be used as main body.

(Process 6)

Figure 9F:
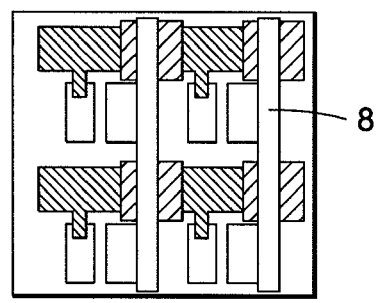
Figure 9C:
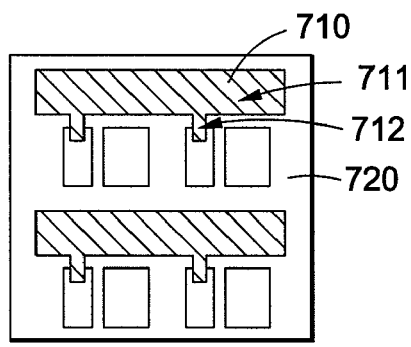

Next, the second wiring 8 is provided (FIG. 9F).

The second electrode 92 and the second wiring 8 can be connected in this process. The second wiring 8 may be provided by employing a method of printing conductive paste at a predetermined location and baking it like the first wiring (4, 5). To form the second wiring 8 in a small width, it is permissible to adopt a method of printing conductive paste having photosensitivity as the conductive paste and after exposing under a predetermined pattern, developing and baking. Although the printing method is preferred as a manufacturing method of the second wiring 8, it is not restricted to this method but a well known wiring manufacturing method may be adopted.

In the above-described process, insulation of an intersection between the first wiring (4, 5) and the second wiring 8 is secured and matrix wiring having a low resistance and stable in connection between the first electrode 91 and the first wiring (4, 5) can be formed. In the meantime, although the first wiring (4, 5) is formed after the first electrode and the second electrode 2 are provided, the first electrode and the second electrode 2 may be formed after the first wiring (4, 5) is formed. Further, the second process may be carried out after the third-sixth processes are executed. That is, although executing the second process before the third process is easier and preferable, it is not limited to any particular order with respect to processes of the first wiring (4, 5), the insulation layer 7 and the second wiring 8.

(Process 7)

Figure 9G:
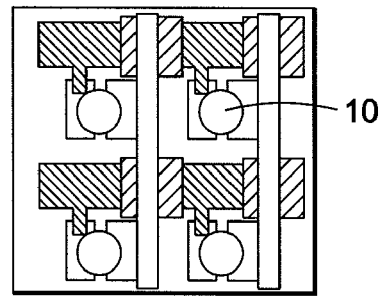
Figure 9D:
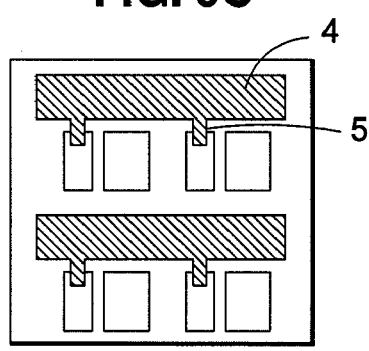

When a surface-conduction electron-emitting device is formed, subsequently, conductive film 10 is provided to connect between the first electrode 91 and the second electrode 92 (FIG. 9G).

Although PdO film or carbon film may be used as the conductive film 10, the material of the conductive film 10 is not restricted to these. The thickness of the conductive film 10 is preferred to be in a range of 5 nm to 100 nm considering resistance value.

(Process 8)

Figure 9H:
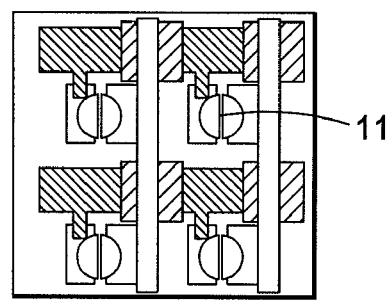

Subsequently, gap 11 is provided in the conductive film 10 (FIG. 9H).

The gap 11 may be formed with Joule heat generated by feeding current to the conductive film 10 when pulse voltage is applied between the first wiring 4 and the second wiring 8 repeatedly.

Preferably, activation process is executed by applying pulse voltage between the first wiring 4 and the second wiring 8 in carbon contained environment. The electron-emitting characteristic can be improved by executing activation process. In the activation process, carbon film having a smaller gap than the aforementioned gap 11 is provided.

The electron source in which the electron-emitting devices are arranged in a matrix form by above manner can form an excellent electron source which is highly fine, has a small variation in characteristic and a small change in orbit of emitted electron. As a factor which enables such an excellent electron source to be formed, the wiring 4 having a large section and a low resistance can be provided in the groove 2 and further, it can be connected to an electrode of the electron-emitting device stably so that a variation of voltage supplied to each electron-emitting device can be decreased. Further, as another factor, because a low resistance wiring can be disposed within the groove 2 provided in the substrate 1 preliminarily, highly fine wiring can be produced easily and further because a distance from the top end of the wiring to the surface of the substrate 1 can be suppressed, influence of the wiring upon the orbit of emitted electron can be suppressed. In the meantime, although a process for forming the electron source has been shown specifically here, at least the process 1, the process 3 and the process 4 are executed to form a wiring board.

The electron-emitting device which may apply this embodiment includes a field emission electron-emitting device using a carbon fiber such as carbon nano-tube and MIM type electron-emitting device.

<Image Display Apparatus>

Figure 7:
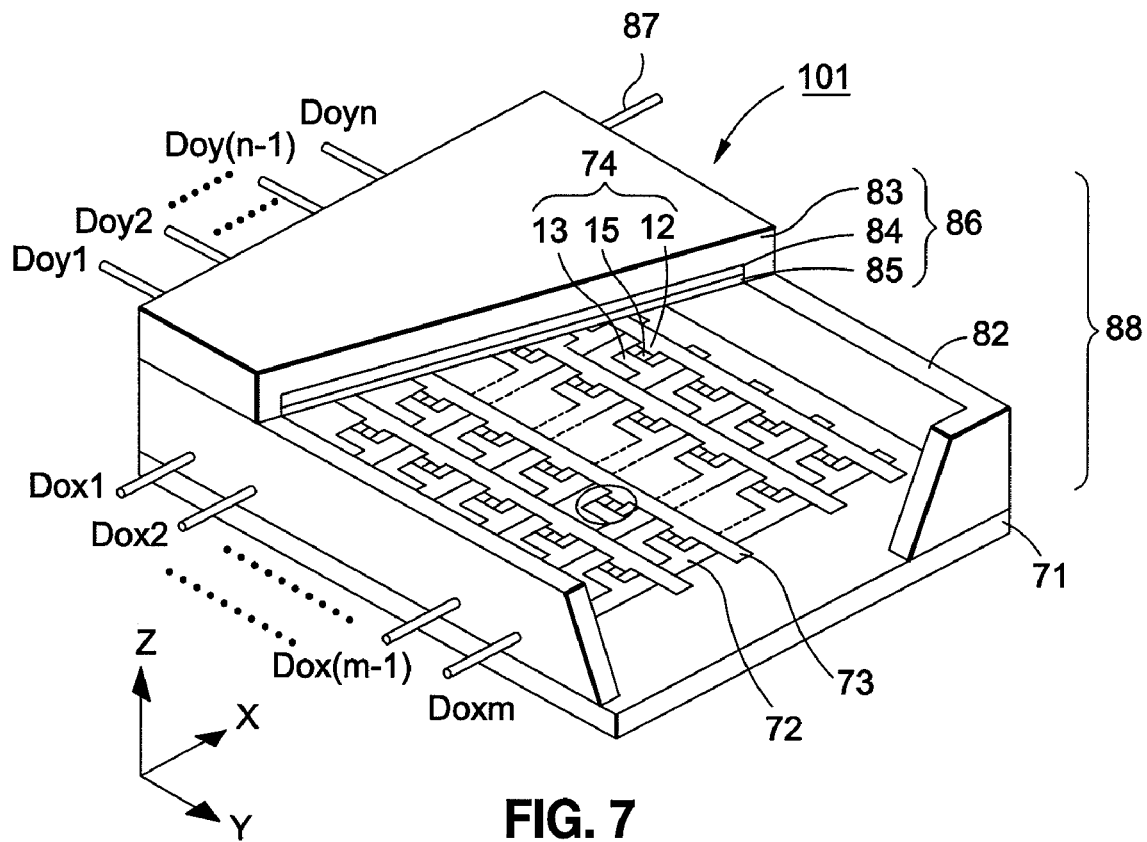
FIG. 7 is a sectional schematic view of electrode and wiring formed according to print method.

FIG. 7 shows an example of the image display apparatus having an electron source in which the electron-emitting devices are arranged in a matrix form.

The X-direction wiring 72 corresponds to the first wiring (4, 5) described above and the Y-direction wiring 73 corresponds to the second wiring 8 described above. A pair of the electrodes 12, 13 corresponds to the above-mentioned first electrode 91 and second electrode 92. Reference numeral 15 corresponds to the conductive film 10 having the gap 11. The electron-emitting device is constituted of the pair of the electrodes 12, 13 and the conductive film 15 having the gap.

A rear plate 71 corresponds to the aforementioned substrate 1. Reference numeral 86 denotes a face plate, in which light emitting layer 84 (corresponds to a light-emitting member) which emits light when it is irradiated with electron beam and an anode electrode 85 are provided on the surface of glass substrate 83. Supporting frame 82 is provided between the rear plate 71 and the face plate 86. A container 88 which holds the interior in vacuum is constituted of the rear plate 71, the face plate 86 and the supporting frame 82. Terminals (Dox1-Doxm) are connected to each of the X-direction wirings 72 and terminals (Doy1-Doyn) are connected to each of the Y-direction wirings 73. A terminal 87 to be connected to a high voltage power supply is connected to the anode electrode 85. A flat panel display 101 is constituted of this container and a drive circuit (not shown).

An image reproducing apparatus can be constituted using a display panel (88) of this embodiment described in FIG. 7.

More specifically, a signal contained in a receiving unit, a tuner for selecting a received signal and a selected signal is outputted to the display panel (88) so that it is displayed or reproduced on a screen. The receiving unit can receive a broadcasting signal of TV broadcasting or the like or a signal sent through wireless network, telephone network, digital network, analog network, or electric communication network such as Internet connected with TCP/IP protocol. The signal contained in the above-mentioned selected signals refers to at least one of video signal, character information and audio information. An information display/reproducing unit such as TV can be constituted of this configuration. Of course, if the broadcasting signal is encoded, the image reproducing apparatus of the present invention can include a decoder. The audio signal is outputted to an audio reproducing means such as a speaker provided separately and reproduced synchronously with video information or character information displayed on the display panel (88).

The method for displaying and/or reproducing video information or character information on a screen by outputting to the display panel 88 can be executed as follows. First, an image signal corresponding to each pixel of the display panel 88 is generated from received video information or character information. Then, generated image signal is inputted to a drive circuit (C12 in FIG. 8) of the display panel 88 (C11 in FIG. 8). Voltage applied to each electron-emitting device within the display panel 88 from the drive circuit is controlled based on an image signal inputted to the drive circuit so as to display the image.

<TV Unit>

Figure 8:
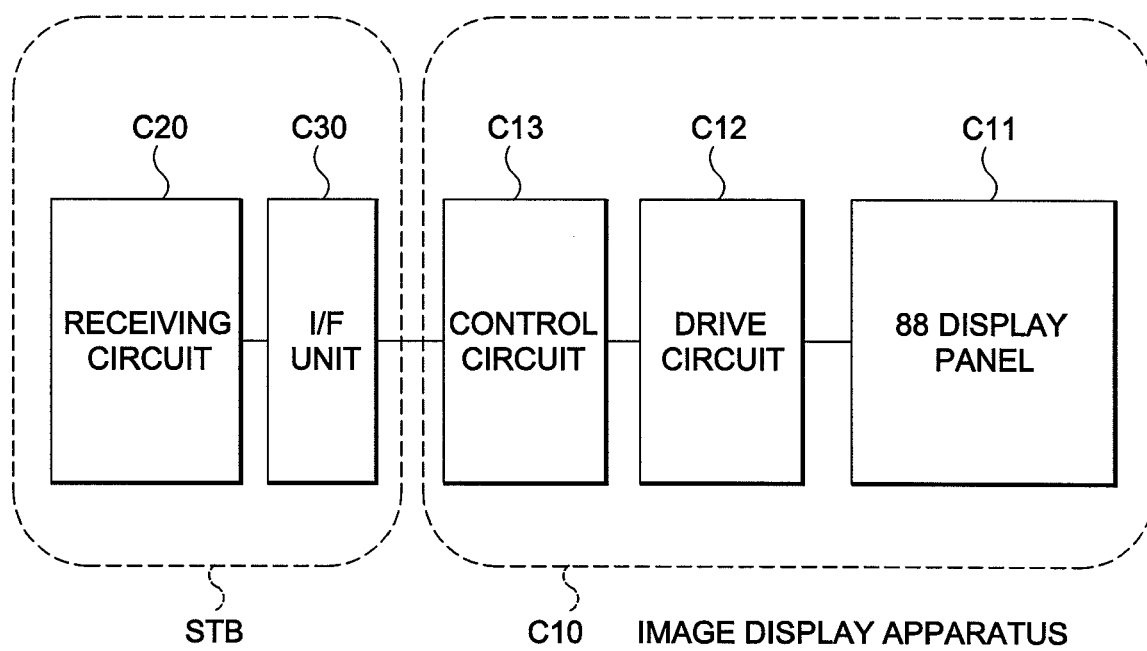
FIG. 8 is a block diagram of a TV unit according to the present invention.

FIG. 8 is a block diagram of the TV unit according to an example of the image reproducing apparatus. The receiving circuit (C20) is constructed of a tuner, decoder or the like to receive TV signal of satellite broadcasting, terrestrial wave or the like and data broadcasting through wireless network, telephone circuit, digital network, analog network, electric communication line such as Internet connected with TCP/IP protocol and output decoded video data to the I/F (interface portion) (C30). The I/F portion (C30) converts video data to a display format of the display unit and outputs image data to the display panel (C11). The image display unit (C10) includes a display panel (C11), a drive circuit (C12) and a control circuit (C13). The control circuit executes image processing such as correction processing suitable for the display panel on the inputted image data and outputs image data and various control signals to the drive circuit (C12). The drive circuit (C12) outputs a drive signal to each wiring 7 (see Dox1-Doxm, Doy1-Doyn in FIG. 7) of the display panel (C11) based on the inputted image data, so that TV image is displayed. The receiving circuit (C20) and the I/F portion (C30) may be incorporated in a separated unit from the image display unit (C10) as a set top box (STB) or contained in the same casing as the image display unit (C10).

The interface can be so constructed to be capable of being connected to such an image recording unit or image output unit as printer, digital video camera, digital camera, hard disk drive (HDD) and digital video disk (DVD). Then, an image recorded on the image recording unit can be displayed on the display panel (C11). Further, the image reproducing apparatus (for example, TV) capable of processing an image displayed on the display panel (C11) and outputting to the image output unit can be constructed as required.

The configuration of the image reproducing apparatus described here is an example and can be modified in various ways based on the technical spirit of the present invention. By using the image reproducing apparatus of the present invention, a variety of image reproducing apparatuses can be constructed by connecting to a TV conference system or a computer.

EXAMPLES

The embodiment of the present invention will be indicated below. An example of providing the electron-emitting device on a side of the first wiring 4 has been described with reference to FIG. 9. In this embodiment, an example of providing the electron-emitting device on both sides of the first wiring 4 will be described. FIG. 9 will be referred to appropriately in description of the manufacturing process. In the meantime, the glass substrate 1 is employed as the substrate 1.

Example 1

Figure 1:
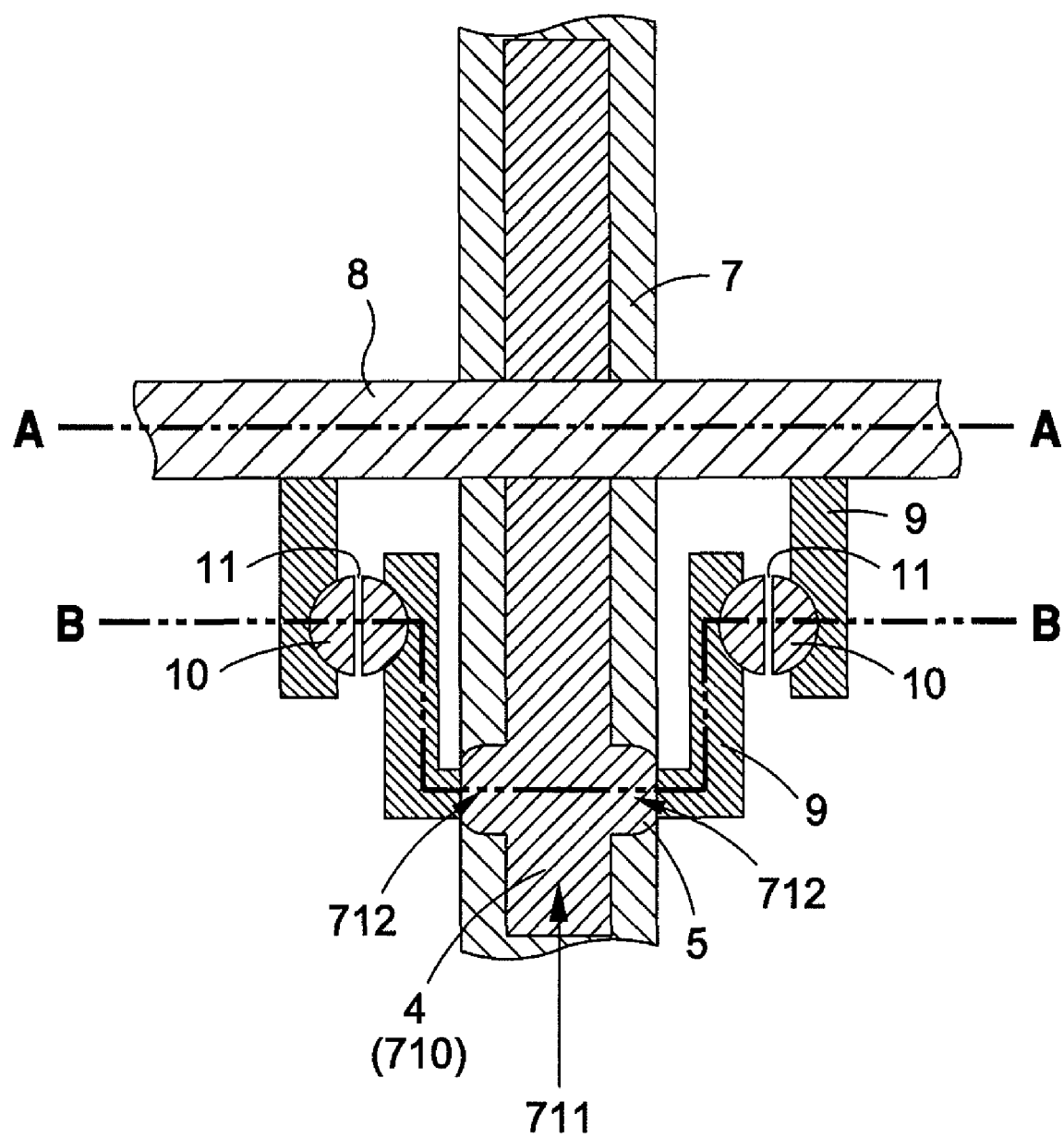
FIG. 1 is a plan schematic view of an example of the electron source using the wiring board and electron-emitting device of the present invention.
Figure 2:
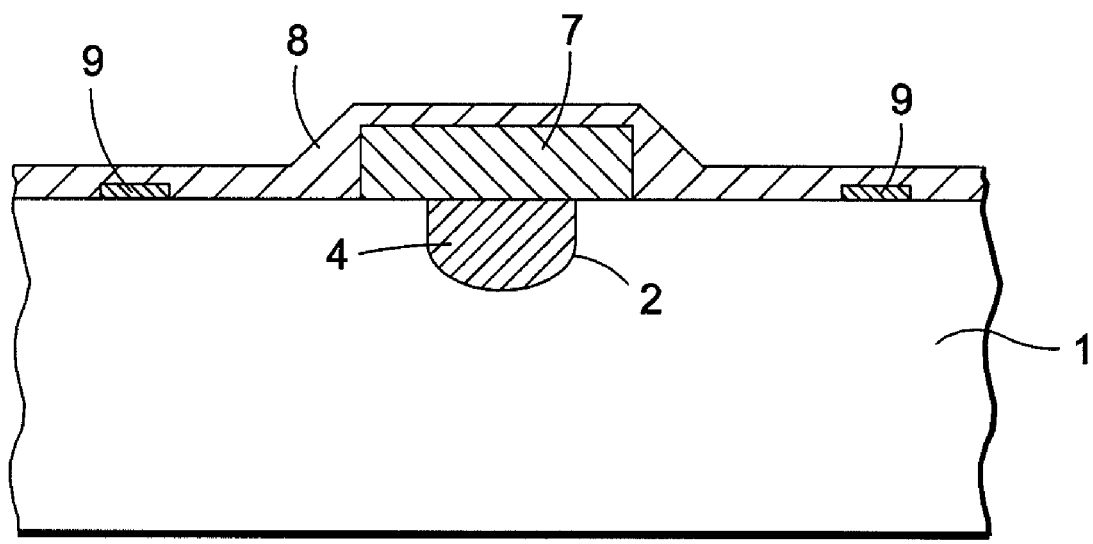
FIG. 2 is a sectional schematic view taken along the line A-A in FIG. 1.
Figure 3:
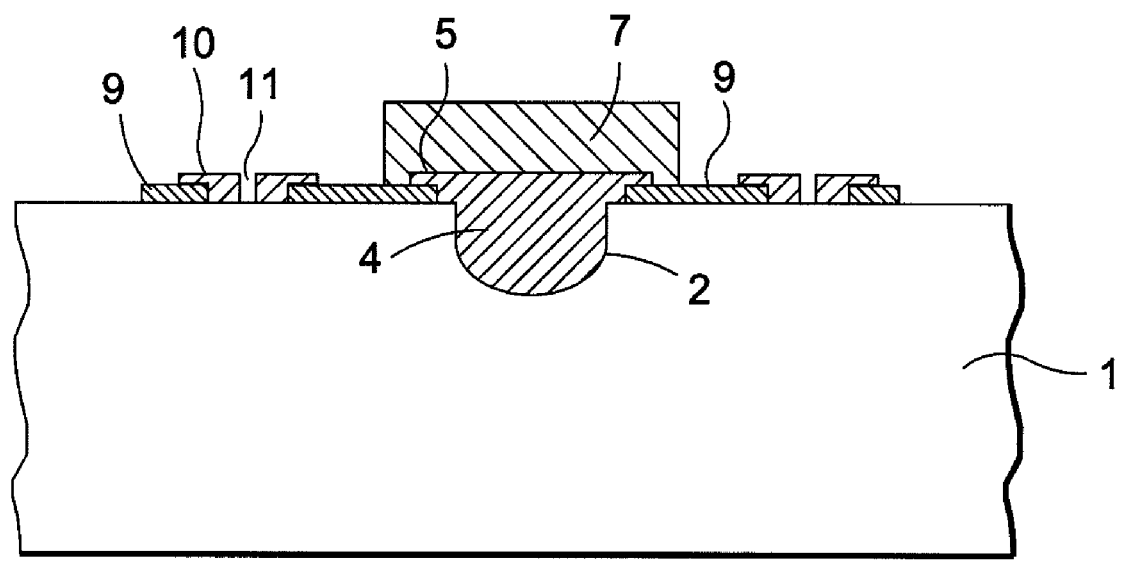
FIG. 3 is a sectional schematic view taken along the line B-B in FIG. 1.

A matrix glass substrate shown in FIGS. 1-5 was produced. FIG. 1 is a plan schematic view of part of an electron source glass substrate produced in this example, FIG. 2 is a sectional schematic view taken along the line A-A in FIG. 1 and FIG. 3 is a sectional schematic view taken along the line B-B in FIG. 1.

First, the glass substrate 1 was prepared. Dry film resist was overlaid on the glass substrate 1 and resist of only a portion in which the groove 2 was formed was melted and protective film was formed.

Next, the groove 2 having a groove width of 300 micron and a groove depth of 50 micron was formed using sand blast method (FIG. 9A).

Next, dry film resist was peeled and next, $SiO_2$ film was formed on the entire glass substrate surface.

A pair of electrodes (91, 92) of platinum was formed (FIG. 9B). The pair of the electrodes (91, 92) corresponds to reference numeral 9 in FIG. 1.

The grooves were formed in the entire surface of the glass substrate 1 using oil repellent agent (alkyl silane coupling agent). The contact angle of the surface of the glass substrate 11 was 50° with respect to butyl carbitol acetate (BCA) by this processing.

Next, positioning between the glass substrate 1 and the photo mask having the light transmitting portion and light shielding portion was carried out and ultraviolet light was projected using a low-pressure mercury lamp (wavelength: 254 nm). That is, the first area (711) and the second area (712) corresponding to the groove 2 was irradiated with ultraviolet light so as to change the lipophilic property with respect to the third area (720) which is other area of the substrate 1 (the other portion still had oil repellent property) (FIG. 4, FIG. 9C). An oil repellent pattern 3 was formed in an area not irradiated with ultraviolet light. In the meantime, the second area (712) includes part of the electrode (9).

Figure 4A:
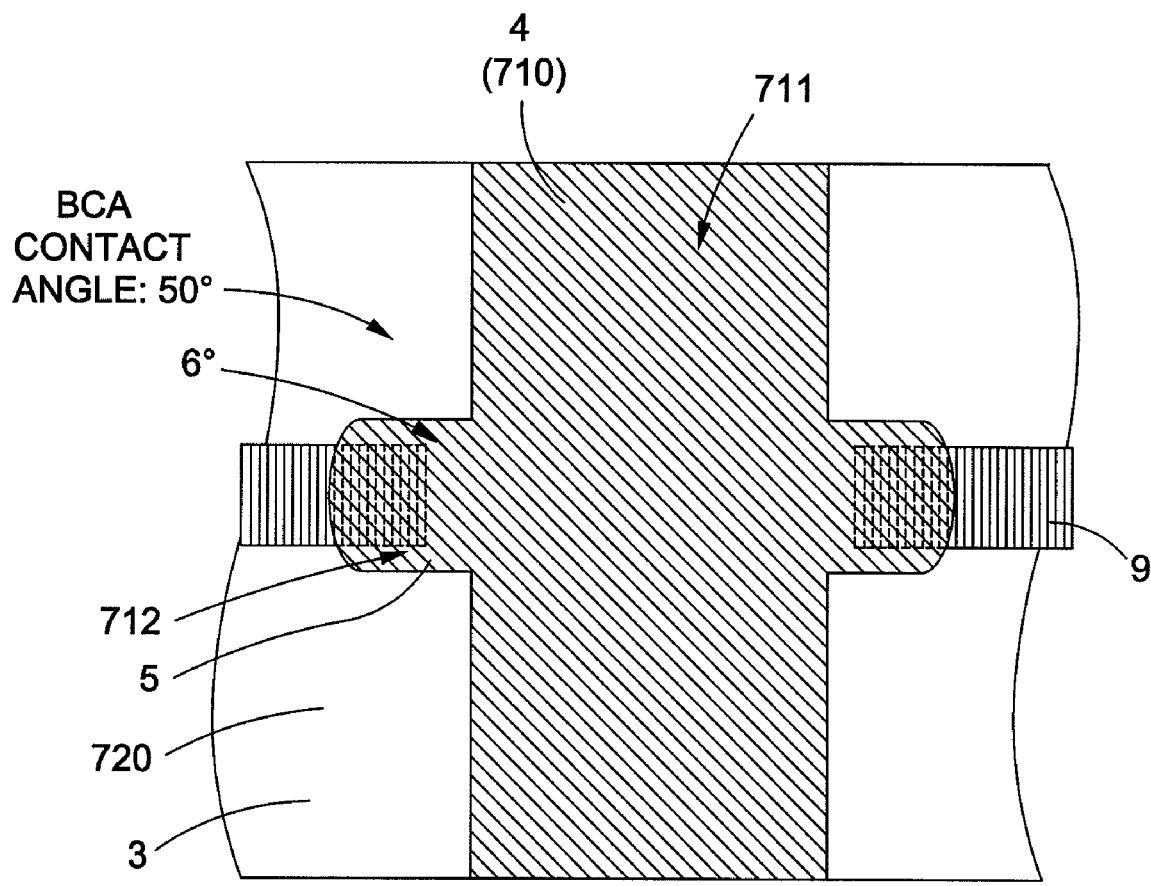
FIGS. 4A, 4B are a plan schematic view and a sectional schematic view after the conductive paste is dried.
Figure 4B:
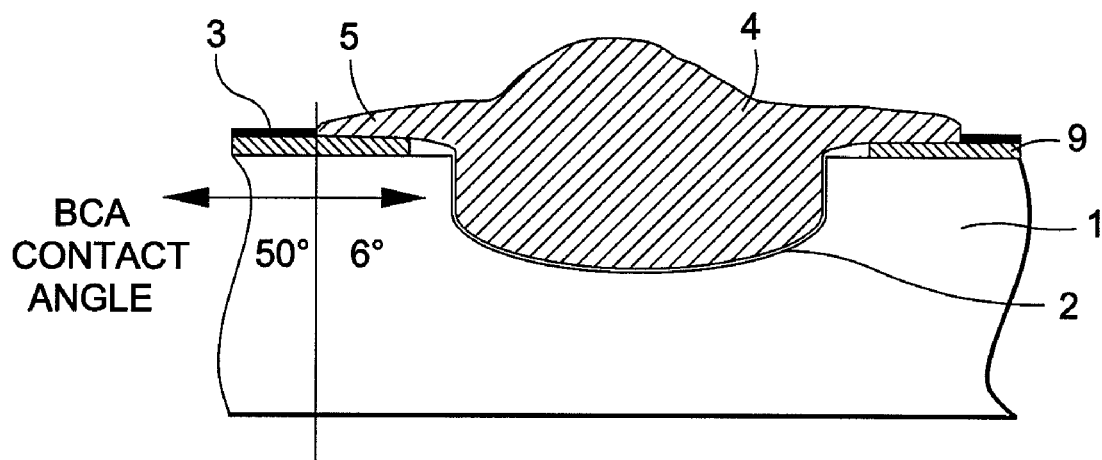

The oil repellent agent located in the area irradiated with ultraviolet light (first and second areas) is dissolved. The contact angle of the lipophilic area (711, 712) formed due to dissolution of oil repellent agent turned to 6° relative to the BCA and a difference in contact angle of more than 40° was provided between the oil repellent area (720) and the lipophilic area (711, 712) (FIG. 4A, 4B).

Next, conductive paste 4 (Ag paste (which contains glass frit component of 0.3 wt % with butyl carbitol acetate as main solvent)) was printed to be dropped into the groove 2 according to screen printing method. At this time, it was charged so that it was swollen by 70 micron from the surface of the glass substrate 1. After that, this glass substrate was left under normal temperature for 20 minutes so as to spread conductive paste 4 sufficiently over the first area 711 and the second area 712 (FIG. 4B).

Because conductive paste spread over an area having high lipophilic property (711, 712), conductive paste flows so that it extends up to the electrode 9. When the conductive paste reaches the border with the area having a low lipophilic property (720), the conductive paste is blocked by that portion so that part of the electrode 9 is covered with conductive paste.

Figure 5A:
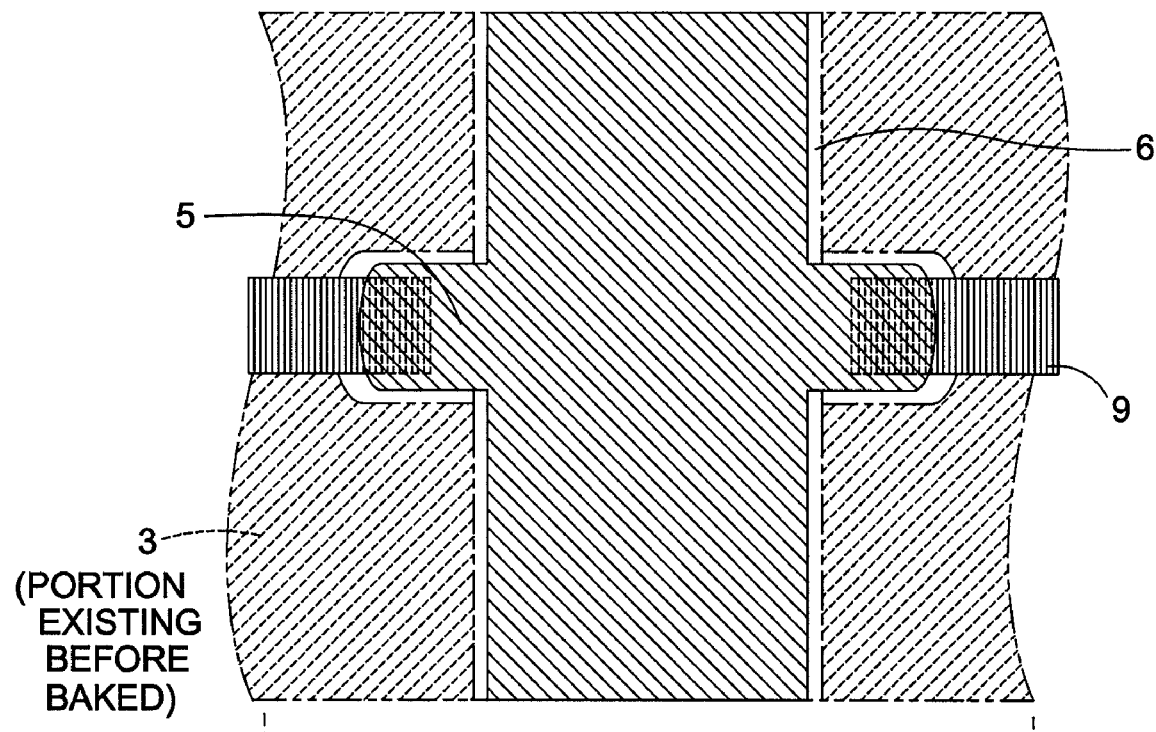
FIGS. 5A, 5b are a plan schematic view and a sectional schematic view after the conductive paste is baked.
Figure 5B:
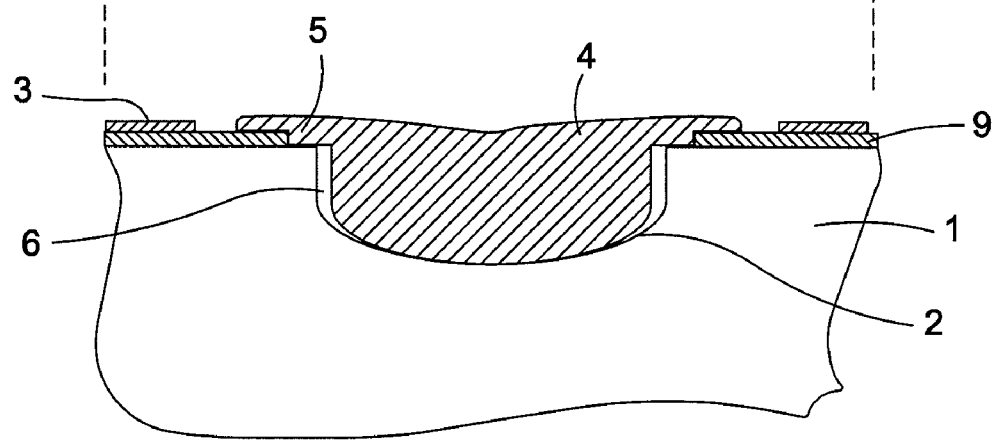

Next, after the solvent is dried, the first wiring (4, 5) (corresponds to scanning wiring) substantially flat relative to the glass substrate surface connected to the electrode 9 was produced by baking in the air (FIG. 5, FIG. 9D). The pattern 3 (oil repellent agent) can be eliminated by baking in the air.

Insulation paste in which photosensitive material is mixed is applied to the entire surface of the glass substrate 1 and the insulation layer 7 is formed on the first wiring (4, 5) using photo lithography method (FIG. 9E).

Next, the second wiring 8 (corresponds to the signal wiring) was formed using the same conductive paste as the conductive paste for use in forming the first wiring (4, 5) by coating and baking according to the printing method so as to produce a wiring substrate having the matrix wiring (FIG. 9F).

Although the gap 6 of 7 micron was generated between the groove 2 and the first wiring, connecting condition between the electrode 9 and wiring (4, 5) was excellent.

After organic palladium contained solution was applied to connect the pair of the electrodes 9 according to ink jet method, conductive film 10 composed of palladium oxide (PdO) was formed by heat treatment.

After that, gap 11 was generated in part of the conductive film 10 by applying pulse voltage between the first wiring and the second wiring repeatedly. Subsequently; an electron source was formed by activation processing of applying pulse voltage between the first wiring 4 and the second wiring 8 in carbon contained environment repeatedly (FIG. 9H).

As a result of driving the electron source produced according to this embodiment, an electron source which was stable in a long period and had a small variation in electron-emitting characteristic could be obtained.

Example 2

Formation of the groove 2, formation of the electrode 9 and formation of the oil repellent pattern were carried out in the same manner as the first example and conductive paste (Ag paste (1.0 wt % in glass frit component) having a small contraction amount when baked according to the first example) was printed to be dropped into the groove 2 by the screen printing method.

When applying conductive paste into the groove 2, the conductive paste is applied so as to be swollen by 20 micron or substantially flat with respect to the surface of the glass substrate 1 after baking considering shrinkage by baking of Ag material.

Figure 6:
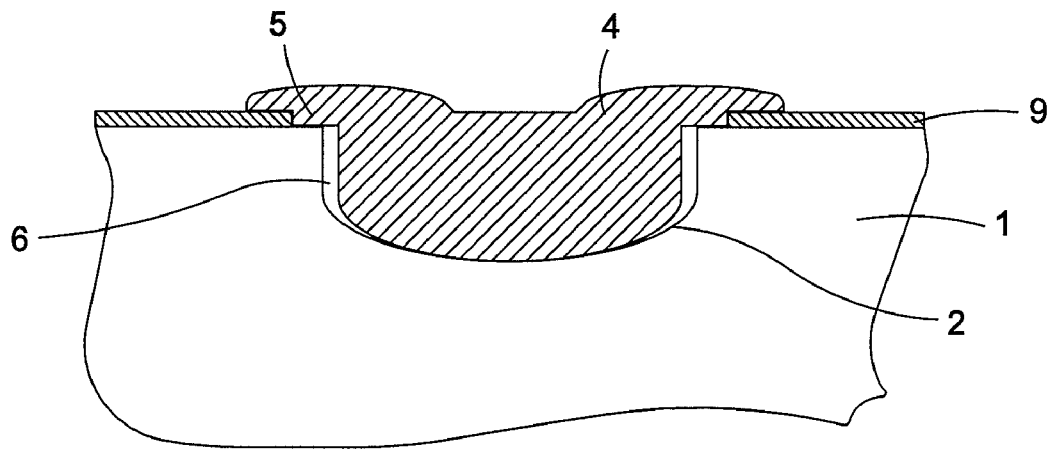
FIG. 6 is a sectional schematic view of electrode and wiring formed according to print method.

Next, after solvent is dried, the glass substrate is baked in the air so as to produce the first wiring (4, 5) substantially flat with respect to the surface of the glass substrate 1 (FIG. 6). Consequently, reliability of connection between the electrode provided on the surface of the glass substrate located nearby the groove and the wiring provided in the groove could be improved.

A subsequent process was executed in the same manner as the first example so as to produce an electron source connected to the matrix wiring.

Although the gap 6 of 2 micron was generated between the inner wall of the groove 2 and the first wiring due to shrinkage by baking of Ag material, connection between the electrode 9 and the first wiring (4, 5) was excellent. Provision of the gap 6 can prevent occurrence of crack or crevice in the glass substrate 1.

Then, the image display unit constituted of a display panel shown in FIG. 7 was formed by disposing a face plate 86 comprising fluorescent film 84 and metal back 85 to oppose an electron source created in this way. As a result of displaying an image by applying a predetermined voltage appropriately to each signal wiring (second wiring 8) and each scanning line (first wiring 4), an image stable in a long period could be obtained. Further, no scanning line was peeled from the glass substrate 1 or no fine crack was generated in the surface of the glass substrate 1 when heat generated upon manufacturing or driving was applied and connection between each electron-emitting device and wiring was stable. As described above, according to this embodiment, connection between the first wiring 4 provided in the groove 2 of the substrate 1 and the electrode 9 disposed nearby the groove 2 can be formed stably, a highly fine matrix wiring structure can be formed at a low cost in terms of material and process and an extremely excellent, flat panel display can be formed easily.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2006-189282 filed on Jul. 10, 2006 which is hereby incorporated by reference herein.

What is claimed is:

1. A method of manufacturing a wiring board comprising A) a substrate having a groove and an adjacent area adjacent to the groove and (B) a first wiring having a first portion and a second portion extending from the first portion, the first portion being provided in a first area in the groove and the second portion being provided in a second area which is part of the adjacent area, the method comprising steps of:

preparing a substrate having a groove;

making a contact angle of the second area smaller than a contact angle of a third area which is another part of the adjacent area, surrounding the second area together with the groove, by means of coating the surface of the substrate with oil repellent material and irradiating the first and the second area with ultraviolet light so as to make the first and the second area more lipophilic than other area; and applying conductive paste to at least the first area and the second area.

2. A method of manufacturing a wiring board according to claim 1 wherein the adjacent area is flat relative to the groove.

3. A method of manufacturing a wiring board according to claim 1 further comprising a step of providing an electrode in the adjacent area before applying the conductive paste to the interior of the groove and the part of the adjacent area, wherein the conductive paste covers at least part of the electrode.

4. A method of manufacturing a wiring board according to claim 1 wherein the contact angle is defined with respect to main solvent of the conductive paste and the contact angle of the second area is smaller than the contact angle of the third area.

5. A method of manufacturing a wiring board according to claim 1 wherein a difference between the contact angle of the second area and the contact angle of the third area is 20° to 70° with respect to the main solvent of the conductive paste.

6. A method of manufacturing a wiring board according to claim 1 further comprising steps of:

providing a second wiring which is located on the first wiring and intersecting the first wiring; and providing insulation layer between the first wiring and the second wiring.

7. A method of manufacturing an electron source comprising a wiring board having a first wiring and a second wiring and a plurality of electron-emitting devices which are disposed on the wiring board and have a first electrode connected to the first wiring and a second electrode connected to the second wiring, wherein the wiring board is manufactured according to the manufacturing method of wiring board according to claim 6.

8. A manufacturing method of an image display apparatus comprising an electron source and a light-emitting member which emits light when electrons emitted from the electron source are irradiated, wherein the electron source is manufactured according to the manufacturing method of electron source according to claim 7.

9. A method of manufacturing a wiring board comprising (A) a substrate having a groove and an adjacent area adjacent to the groove and (B) a first wiring having a first portion and a second portion extending from the first portion, the first portion being provided in a first area in the groove and the second portion being provided in a second area which is part of the adjacent area, the method comprising steps of:

preparing a substrate having a groove;

making a contact angle of the second area smaller than a contact angle of a third area which is another part of the adjacent area, sandwiching the second area, by means of coating the surface of the substrate with oil repellent material and irradiating the first and the second area with ultraviolet light so as to make the first and the second area more lipophilic than other area; and applying conductive paste to at least the first and the second area.

10. A method of manufacturing a wiring board according to claim 9 wherein the adjacent area is flat relative to the groove.

11. A method of manufacturing a wiring board according to claim 9 further comprising a step of providing an electrode in the adjacent area before applying the conductive paste to the interior of the groove and the part of the adjacent area, wherein the conductive paste covers at least part of the electrode.

12. A method of manufacturing a wiring board according to claim 9 wherein the contact angle is defined with respect to main solvent of the conductive paste and the contact angle of the second area is smaller than the contact angle of the third area.

13. A method of manufacturing a wiring board according to claim 9 wherein a difference between the contact angle of the second area and the contact angle of the third area is 20° to 70° with respect to the main solvent of the conductive paste.

14. A method of manufacturing a wiring board according to claim 9 further comprising steps of:

providing a second wiring which is located on the first wiring and intersecting the first wiring; and providing insulation layer between the first wiring and the second wiring.

15. A method of manufacturing an electron source comprising a wiring board having a first wiring and a second wiring; and a plurality of electron-emitting devices which are disposed on the wiring board and have a first electrode connected to the first wiring and a second electrode connected to the second wiring, wherein the wiring board is manufactured according to the manufacturing method of wiring board according to claim 14.

16. A manufacturing method of an image display apparatus comprising an electron source and a light-emitting member which emits light when electrons emitted from the electron source are irradiated, wherein the electron source is manufactured according to the manufacturing method of electron source according to claim 15.

* * * * *